(12) United States Patent
Krajewski et al.

(10) Patent No.: US 11,502,686 B2
(45) Date of Patent: Nov. 15, 2022

(54) ELECTRICAL SWITCH ASSEMBLY COMPRISING A PIEZOELECTRIC SENSOR DISPOSED BETWEEN PARALLEL MOUNTING PLATES

(71) Applicant: Wikk Industries, Inc., Greendale, WI (US)

(72) Inventors: James R. Krajewski, Milwaukee, WI (US); Josh L. Smith, South Milwaukee, WI (US); Lynn M. Kleppin, Racine, WI (US); Brian D. Hawthorne, Wauwatosa, WI (US); Franklin Bradley, Hawthorn Woods, IL (US); Randall Remblake, Streamwood, IL (US)

(73) Assignee: Wikk Industries, Inc., Greendale, WI (US)

( * ) Notice: Subject to any disclaimer, the term of this patent is extended or adjusted under 35 U.S.C. 154(b) by 1042 days.

(21) Appl. No.: 16/161,911

(22) Filed: Oct. 16, 2018

(65) Prior Publication Data

US 2020/0119733 A1    Apr. 16, 2020

(51) Int. Cl.
| H01L 41/113 | (2006.01) |
| H02N 2/18 | (2006.01) |
| H03K 17/96 | (2006.01) |
| H03K 17/965 | (2006.01) |
| H01H 13/02 | (2006.01) |
| H01H 13/705 | (2006.01) |

(52) U.S. Cl.
CPC ......... *H03K 17/964* (2013.01); *H01H 13/023* (2013.01); *H01L 41/1132* (2013.01); *H02N 2/181* (2013.01); *H03K 17/965* (2013.01); *H01H 13/705* (2013.01); *H03K 2217/96015* (2013.01)

(58) Field of Classification Search
CPC . H01L 41/1132; H03K 17/964; H03K 17/965
USPC ....................................................... 310/338
See application file for complete search history.

(56) References Cited

U.S. PATENT DOCUMENTS

| 4,085,302 A | 4/1978 | Zenk et al. |
| 4,430,595 A | 2/1984 | Nakasone et al. |
| 4,585,970 A | 4/1986 | Koal et al. |
| 5,170,087 A | 12/1992 | Karr et al. |

(Continued)

FOREIGN PATENT DOCUMENTS

WO    WO2010131694    11/2010

*Primary Examiner* — Derek J Rosenau
(74) *Attorney, Agent, or Firm* — Boyle Fredrickson, S.C.

(57) ABSTRACT

The present inventors have recognized that an electrical switch for opening doors in buildings, calling elevators, and the like can be improved to require less physical contact, larger activation area, and multiple activation methods, with increased reliability, by utilizing a piezoelectric sensor specifically arranged between rigid, parallel mounting plates in which one of the plates (an inner plate) is rigidly fixed to prevent movement while the other plate (an outer plate) is accessible for receiving physical contact. By rigidly fixing the inner plate, such as by mounting to a wall or bollard, the sensor can react with sensitivity upon an application of less pressure on the outer plate. Such pressure compresses the sensor between the plates to produce an electrical signal. A controller receiving the signal can, in turn, execute to open a door, call an elevator and/or activate a light or sound to provide feedback.

20 Claims, 8 Drawing Sheets

(56) References Cited

U.S. PATENT DOCUMENTS

| | | | |
|---|---|---|---|
| 5,231,326 A * | 7/1993 | Echols | B66B 1/462 |
| | | | 310/330 |
| 6,310,428 B1 | 10/2001 | Pulli et al. | |
| 7,358,654 B2 | 4/2008 | Aromin | |
| 7,446,456 B2 * | 11/2008 | Maruyama | H01L 41/083 |
| | | | 310/317 |
| 7,688,222 B2 | 3/2010 | Peddie et al. | |
| 10,026,312 B1 * | 7/2018 | George | H01H 57/00 |
| 2004/0257221 A1 * | 12/2004 | Hughes, Jr. | G07C 13/00 |
| | | | 340/539.1 |
| 2010/0102991 A1 | 4/2010 | Hernandez Gonzalez et al. | |
| 2013/0069488 A1 * | 3/2013 | Goodemote | H01L 41/053 |
| | | | 29/25.35 |
| 2014/0035735 A1 * | 2/2014 | Zellers | H02N 2/18 |
| | | | 310/319 |

\* cited by examiner

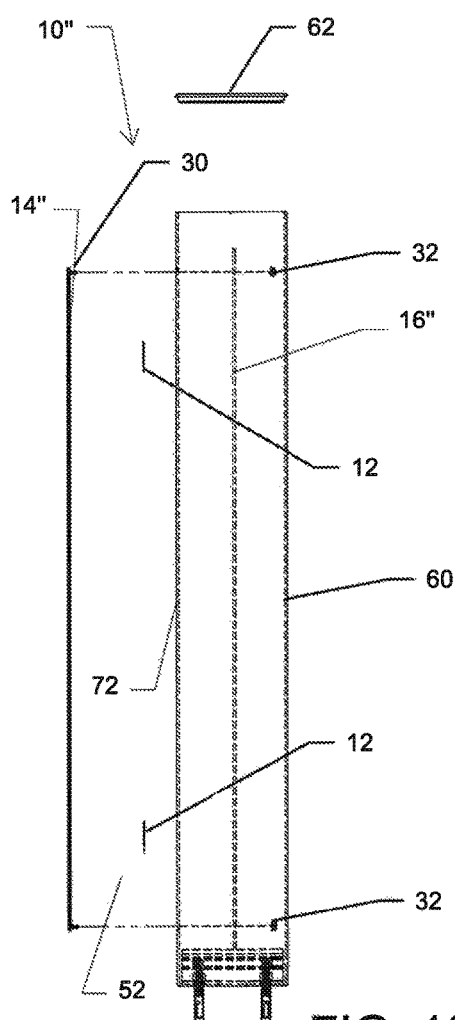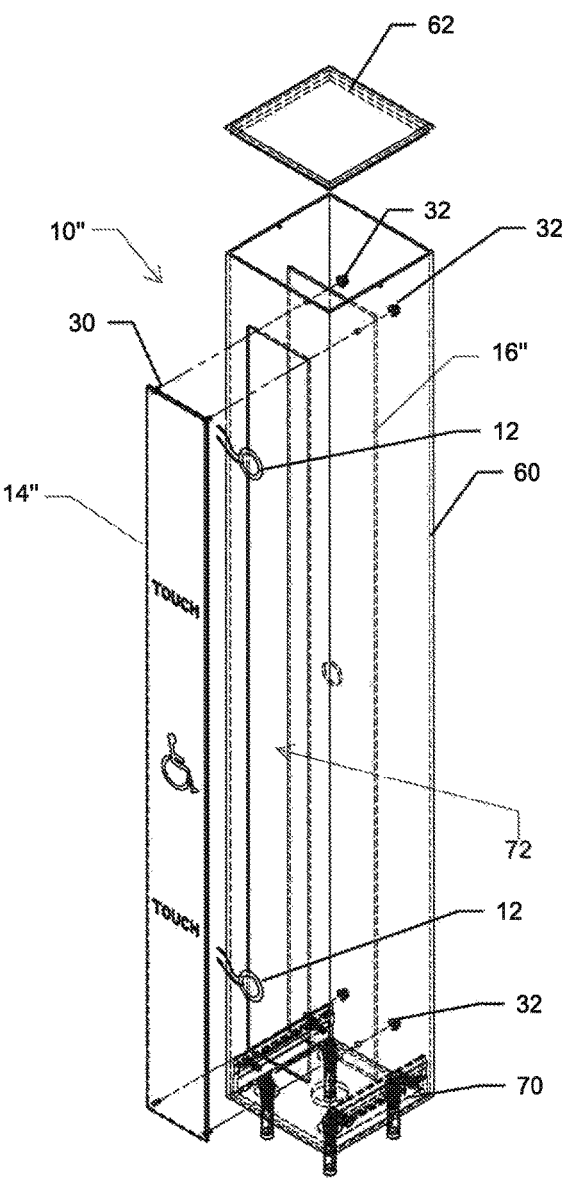
FIG. 10
FIG. 9

ELECTRICAL SWITCH ASSEMBLY COMPRISING A PIEZOELECTRIC SENSOR DISPOSED BETWEEN PARALLEL MOUNTING PLATES

FIELD OF THE INVENTION

The present invention relates to the field of electrical switch assemblies, and more particularly, to an electrical switch assembly comprising a piezoelectric sensor disposed between first and second mounting plates in which the first and second mounting plates are parallel to one another, the piezoelectric sensor is rigidly supported by the first and second mounting plates, and the second mounting plate is rigidly supported to prevent movement.

BACKGROUND OF THE INVENTION

Commercial and residential buildings have long relied upon electrical switches made accessible to disabled persons for opening doors in buildings, calling elevators, and the like. These switches often include a spring-loaded touch portion which must be physically pressed by a person in order to close an electrical contact beneath the touch portion that is sufficient to activate a circuit, such as for opening a motorized door. Although such switches are useful in this capacity, they have several drawbacks, including stiffness in the spring requiring a strong physical contact with the touch portion to activate the circuit (which may be difficult for some to achieve), and/or mechanical wear of components leading to decreased sensitivity and/or failure of the switch over time. In addition, the activation area is typically limited in size, which may make it difficult for someone to reach, see or otherwise be aware that an activation has occurred. What is needed is an improved system for opening doors in buildings, calling elevators, and the like, that eliminates one or more of the foregoing disadvantages.

SUMMARY OF THE INVENTION

The present inventors have recognized that an electrical switch for opening doors in buildings, calling elevators, and the like can be improved to require less physical contact, larger activation area, and multiple activation methods, with increased reliability, by utilizing a piezoelectric sensor specifically arranged between rigid, parallel mounting plates in which one of the plates (an inner plate) is rigidly fixed to prevent movement while the other plate (an outer plate) is accessible for receiving physical contact. By rigidly fixing the inner plate, such as by mounting to a wall or bollard, the sensor can react with sensitivity upon an application of less pressure on the outer plate. Such pressure compresses the sensor between the plates to produce an electrical signal. A controller receiving the signal can, in turn, execute to open a door, call an elevator and/or activate a light or sound to provide feedback. As used herein, "rigid" and "rigidity" refer to stiffness.

Specifically then, one aspect of the present invention can provide a switch assembly including: a piezoelectric sensor and first and second mounting plates, in which the first and second mounting plates each provide rigid planar surfaces in parallel to one another, in which the first mounting plate rigidly supports the piezoelectric sensor on a top surface of the piezoelectric sensor and the second mounting plate rigidly supports the piezoelectric sensor on a bottom surface of the piezoelectric sensor so that the piezoelectric sensor is rigidly supported in between the first and second mounting plates, in which the second mounting plate is rigidly supported to prevent movement, and in which pressure on the first mounting plate compresses the piezoelectric sensor between the first and second mounting plates to induce a mechanical stress on the piezoelectric sensor that is operable to produce an electrical signal, such as for controlling operation of a door or elevator.

Another aspect of the present invention can provide an electrical switching method including: layering a first mounting plate providing a rigid planar surface over a piezoelectric sensor so that the first mounting plate rigidly supports the piezoelectric sensor on a top surface of the piezoelectric sensor; layering a second mounting plate providing a rigid planar surface under the piezoelectric sensor so that the second mounting plate rigidly supports the piezoelectric sensor on a bottom surface of the piezoelectric sensor directly opposing the top surface with the first and second mounting plates being parallel to one another; rigidly supporting the second mounting plate to prevent movement; producing an electrical signal from the piezoelectric sensor upon application of pressure on the first mounting plate compressing the piezoelectric sensor between the first and second mounting plates to induce a mechanical stress on the piezoelectric sensor; and controlling an operation, such as opening a door or calling an elevator, in response to the electrical signal.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which:

FIG. 9 is an exploded view of a rectangular switch assembly mounted on a square bollard in accordance with another aspect of the invention; and FIG. 10 is a detailed cross-sectional view of the switch assembly mounted to the bollard of FIG. 9.

DETAILED DESCRIPTION OF THE INVENTION

Figure 1:
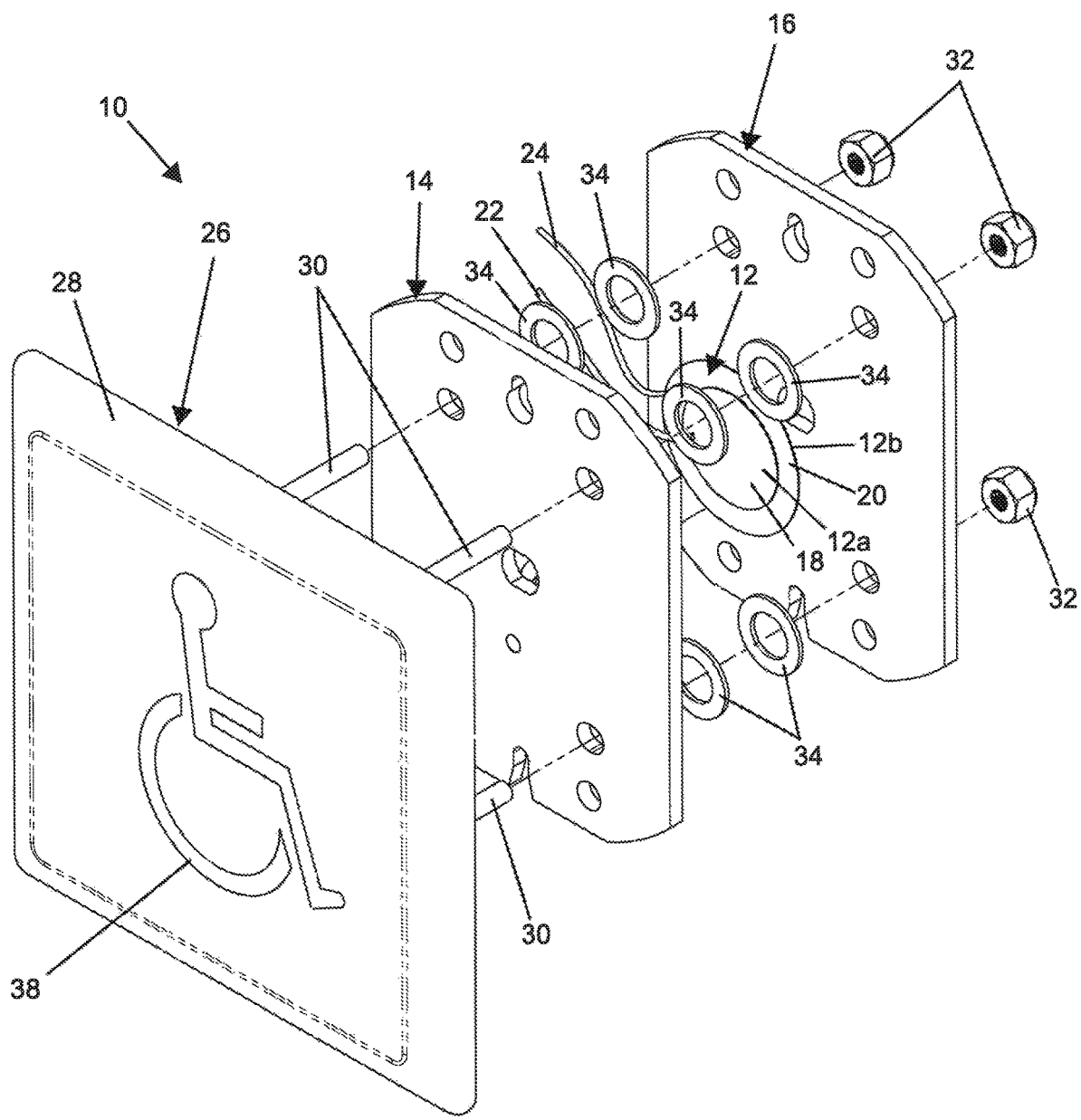
FIG. 1 is an exploded view of switch assembly having a round piezoelectric sensor, inner and outer mounting plates and a rectangular cover in accordance with an aspect of the invention.

Referring now to FIG. 1, in accordance with an aspect of the invention, an electrical switch assembly 10 for opening doors in buildings, calling elevators, activating lights, activating sounds, and the like includes a piezoelectric sensor 12 layered between an outer mounting plate 14, operating as a touch plate with a surface directly or indirectly accessible for physical contact, and an inner mounting plate 16, operating as a pressure plate that is rigidly held in a relatively immovable position, such as being fixed to a bollard or wall. The piezoelectric sensor 12 can comprise a smaller piezoelectric element 18 exposing a top surface 12a, e.g., about 1 inch across in length, mounted to a larger substrate 20 exposing a bottom surface 12b (opposite the top surface 12a), e.g., about 1.4 inches across in length. In one aspect, the piezoelectric element 18 could comprise piezoelectric ceramic, and the substrate 20 could comprise brass or stainless steel. However, in other aspects, the piezoelectric element 18 could comprise crystal materials. In addition, signal and ground conductors 22 and 24, respectively, can be attached to the piezoelectric sensor 12 by solder connections thereto. In particular, the signal conductor 22 can be attached to the piezoelectric element 18, and the ground conductor 24 can be attached to the substrate 20. As a result, operating according to the well-known piezoelectric effect, a mechanical stress on the piezoelectric sensor 12, such as a compression of the piezoelectric element 18 with respect to the substrate 20, can produce an electrical signal having a voltage and current on the signal conductor 22 that is referenced with respect to the ground conductor 24. Conversely, an electrical signal having a voltage and current driven on the signal conductor 22, referenced with respect to the ground conductor 24, can produce a mechanical stress on the piezoelectric sensor 12, such as a deformation of the piezoelectric element 18 with respect to the substrate 20.

The outer and inner mounting plates 14 and 16, respectively, each comprise rigid (unable to bend or be forced out of shape) planar surfaces (substantially flat) that are disposed in parallel to one another. The outer and inner mounting plates 14 and 16, respectively, are preferably angled or rounded rectangular plates (three-dimensional solids whose thicknesses are very small when compared with other dimensions). In addition, the piezoelectric element 18 is disposed in parallel to, and in between, the outer and inner mounting plates 14 and 16, respectively. The outer and inner mounting plates 14 and 16, respectively, can individually comprise a stiff material such as aluminum or steel (such as the outer mounting plate 14 comprising aluminum and the inner mounting plate 16 comprising steel). The outer mounting plate 14 rigidly supports and/or abuts the piezoelectric sensor 12 on the top surface 12a, and the inner mounting plate 16 rigidly supports and/or abuts the piezoelectric sensor 12 on the bottom surface 12b. Such rigidly support and/or abutments are preferably direct, meaning in physical contact with one another without intervening material in between, although a gasket and/or similar layer can be layered between so long as rigidity is maintained. In addition, the inner mounting plate 16 is rigidly supported to prevent movement. This can be accomplished by mounting the inner mounting plate 16 with respect to a wall, bollard or other immovable object. As a result, by rigidly fixing the inner mounting plate 16, and layering the piezoelectric sensor 12 between the outer and inner mounting plates 14 and 16, respectively, reduced pressure on the outer mounting plate 14 will remain operable to sufficiently compress the piezoelectric sensor 12 between the mounting plates to produce the electrical signal on the signal conductor 22. In other words, such a rigid, parallel arrangement allows for a lesser pressure to nevertheless induce a sufficient mechanical stress on the piezoelectric sensor 12, according to the piezoelectric effect, that is operable to produce the electrical signal. In one aspect, a gasket and/or similar layer can be layered between the outer and inner mounting plates 14 and 16, respectively, to ensure proper consistency in torque and/or to limit water intrusion.

In one aspect, the piezoelectric sensor 12 can be round in shape. Also, the outer and inner mounting plates 14 and 16, respectively, can each have surface areas that are at least four times as large as any surface area of the piezoelectric sensor 12 with maintained sensitivity. For example, the outer and inner mounting plates 14 and 16, respectively, can each have a surface area of 64 sq. inches (e.g., 48"×48") or more, while the piezoelectric sensor 12 has a largest surface area of 64 sq. inches (e.g., 2"×2") or less. By providing the piezoelectric sensor 12 in a rectangular or square shape, and by centering the piezoelectric sensor 12 with respect to the outer and inner mounting plates 14 and 16, respectively, the switch assembly 10 can effectively detect smaller applications of pressure at outermost areas of the outer mounting plate 14.

Figure 2:
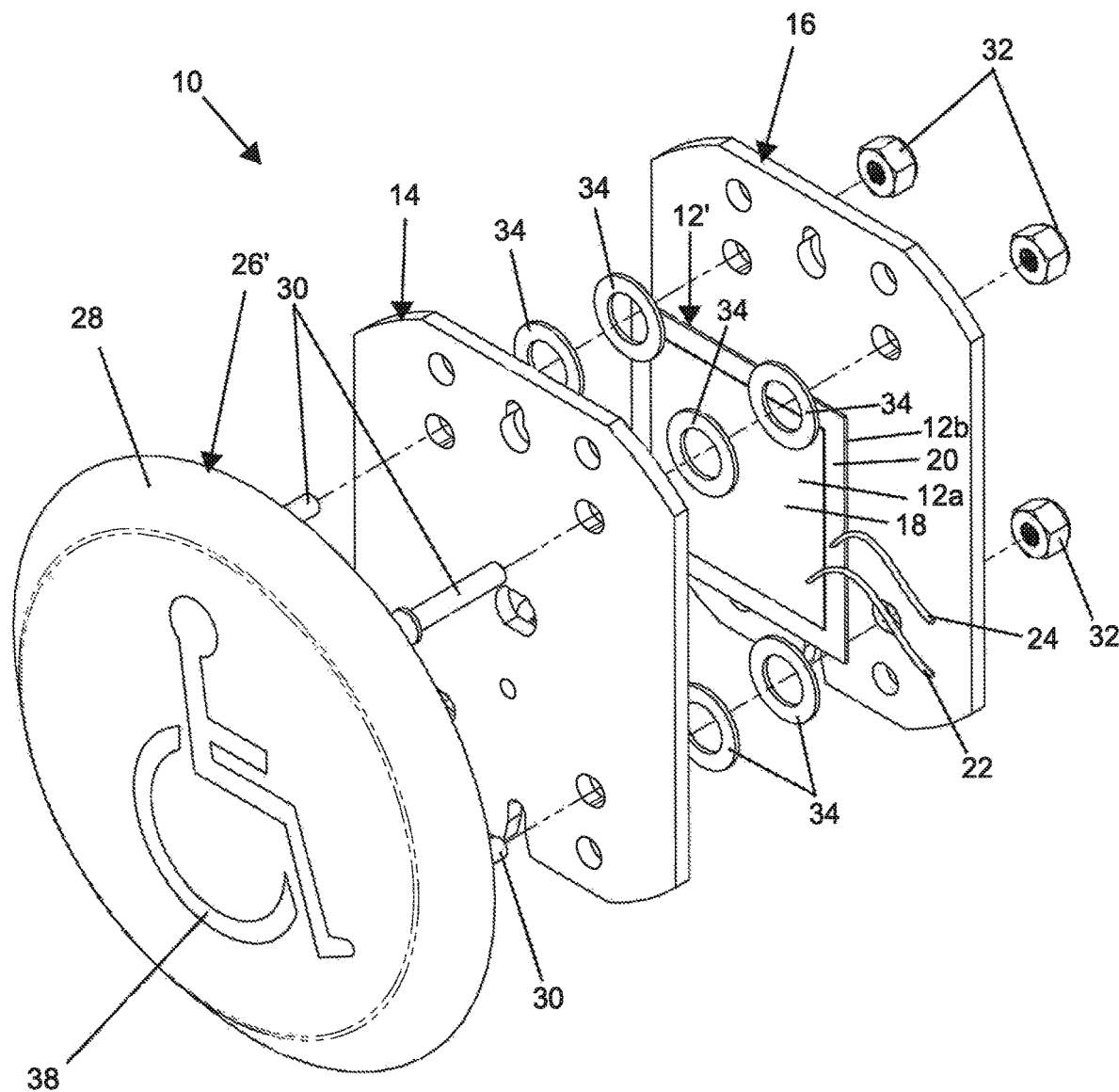
FIG. 2 is an exploded view of switch assembly having a rectangular piezoelectric sensor, inner and outer mounting plate and a round cover in accordance with an aspect of the invention.

In one aspect, a cover 26 can be arranged to abut the outer mounting plate 14. The cover 26 can include a circumferential beveled edge 28 surrounding and conforming to the shape of the outer mounting plate 14. The cover 26 can comprise another stiff material, such as aluminum or steel, so as to maintain a contact path from the outer mounting plate 14, to the piezoelectric sensor 12, and finally, to the inner mounting plate 16 (which is supported to be immovable). The cover 26 can be rectangular as shown in FIG. 1. However, in another aspect, an alternative cover 26' can be round, with attachment to same shaped mounting plates, as shown in FIG. 2, where like numerals refer to like parts throughout. Also, the piezoelectric sensor 12' can be rectangular or square in shape. In addition, the cover 26 (or alternative cover 26') can include various indicia 38, such as an indicium comprising a wheelchair symbol, an indicium comprising a company name, a lightbulb symbol for indication of a light activation, or bell symbol for indication of a sound activation, and the like.

In one aspect, the inner mounting plate 16 can be rigidly supported by an immovable object, such as a wall or bollard, with multiple fasteners 30 joining the outer and inner mounting plates 14 and 16, respectively, together. The fasteners 30 could comprise weld studs or screws passing through variously configurable apertures of the outer and inner mounting plates 14 and 16, respectively, with nuts 32 locking the fasteners 30 in place. The nuts 32 could comprise nylon-insert lock nuts (or "nyloc" nuts) attached to the fasteners 30 on an opposing side of the inner mounting plate 16 to lock the outer and inner mounting plates 14 and 16, respectively, together. Also, layers of washers 34 can be used between the fasteners 30 and the nuts 32, and between the outer and inner mounting plates 14 and 16, respectively, to distribute the load of the fasteners 30.

Figure 3:
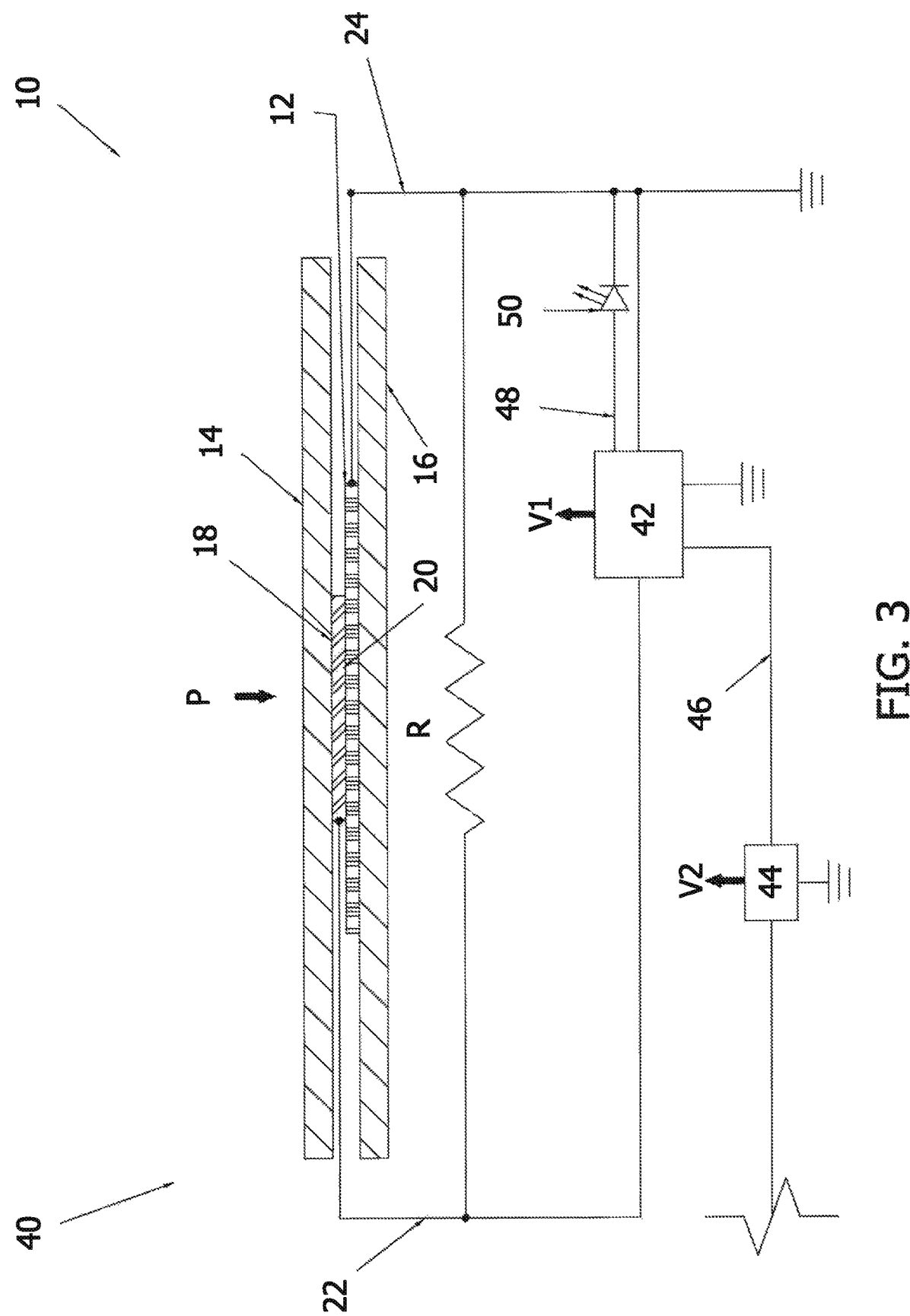
FIG. 3 is schematic of the switch assembly of FIGS. 1 and 2.

Referring now to FIG. 3, where like numerals refer to like parts throughout, a schematic of a system 40 comprising the switch assembly 10 is provided in accordance with an aspect of the invention. In particular, a controller 42 having a processor, memory and I/O ports can receive the electrical signal via the signal conductor 22. The controller 42 could be part of for example, a simple I/O single-board microcontroller. The controller 42 can then execute a program stored in the memory in response to the signal, such as to activate a relay 44 for controlling operation of a door or elevator. The controller 42 could be connected to a low voltage power supply ("V1") which could be powered by a battery. The relay 44 could be connected to a high voltage power supply ("V2") for selectively switching a high voltage or current source, such as for opening a motorized door. A large resistor ("R"), which could be about 1 MR can be arranged between the signal and ground conductors 22 and 24, respectively, to improve low voltage detection of the signal at the controller 42 and to discharge the piezoelectric sensor 12 after it has been pressed down.

In operation, upon a pressure ("P") being applied anywhere on the outer mounting plate 14, translating through a thickness ("t") of the outer mounting plate 14, a resultant mechanical stress (compression) is applied to the piezoelectric sensor 12. In particular, the piezoelectric element 18, between the outer and inner mounting plates 14 and 16, respectively, which are parallel and abutting with stiff, rigid support on opposing sides of the piezoelectric element 18, is only slightly compressed, but nevertheless sufficiently compressed to produce an electrical signal having a voltage and current on the signal conductor 22. This may be equivalent, for example, to a light finger touch. The controller 42, in turn, can detect the signal, differentially, with respect to the ground conductor 24. Then, the controller 42 can execute the program in response to the signal to drive a first output 46 to selectively activate the relay 44 (close contacts) for controlling operation of the door or elevator. After a configurable period of time has elapsed, such as one minute, the controller 42 can then cease to drive the first output 46 to selectively deactivate the relay 44 (open contacts) to cease controlling operation of the door or elevator. In other aspects, the first output 46 can be driven to other logic to achieve other results, typically comprising accessibility in a building, within the scope of the invention.

In addition, upon receiving the electrical signal, the controller 42 can execute to provide feedback indicating the pressure P. For example, the controller 42 can execute to activate a light or sound to provide the feedback. The light could be activated by the controller 42 driving a second output 48 to selectively activate a single or multi-color LED 50 (Light Emitting Diode). The sound could be activated by the controller 42 driving an Alternating Current (AC) periodic signal back to the piezoelectric sensor 12 on the signal conductor 22 (on which the signal was received) to cause an oscillation of the piezoelectric sensor 12. The periodic signal could be, for example, 2-3 kHz. After a configurable period of time has elapsed, preferably less than a second, such as 250 milliseconds, the controller 42 can then cease to drive the second output 48 and/or the periodic signal to cease the light and/or sound.

Figure 4:
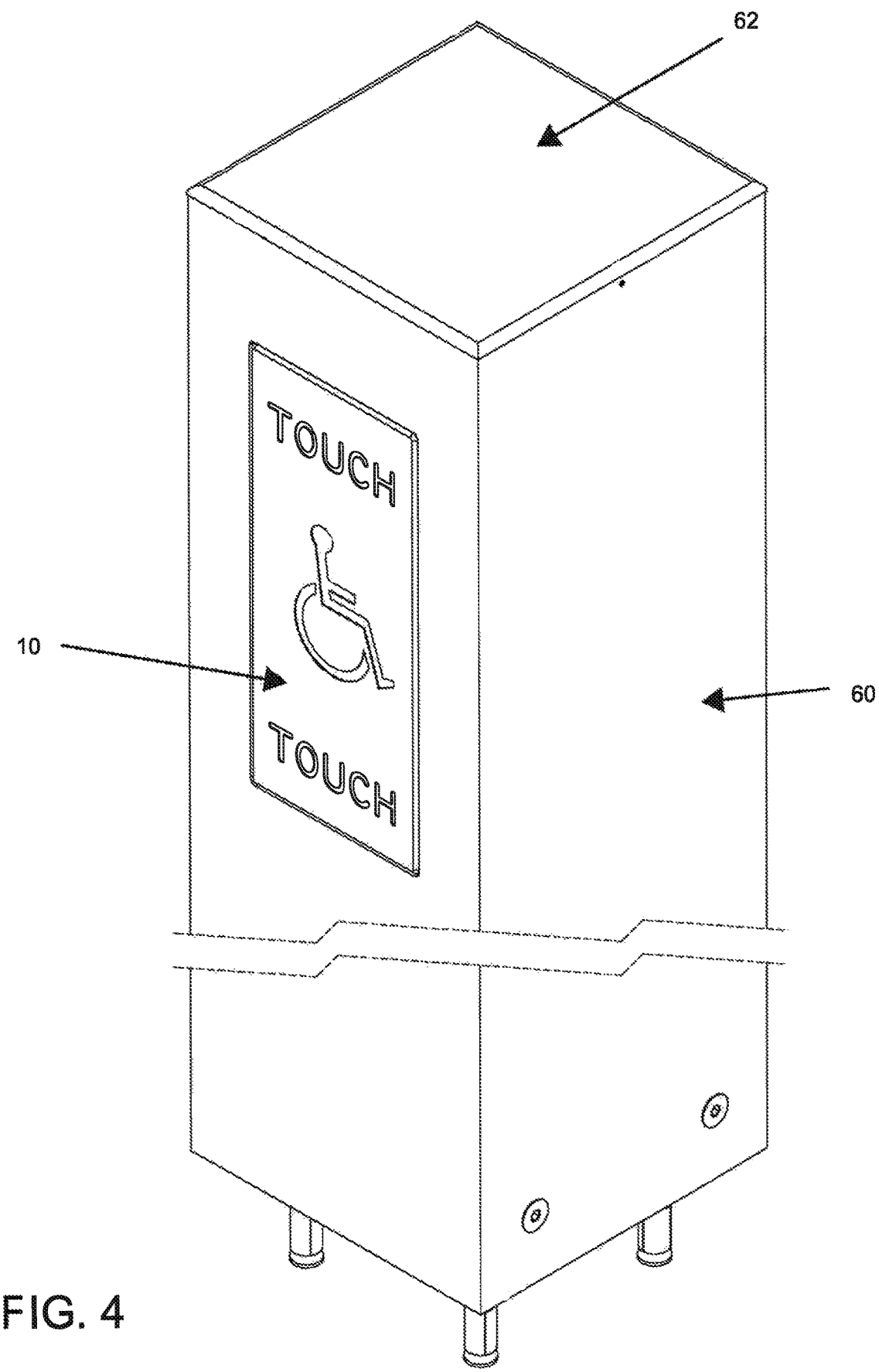
FIG. 4 is a rectangular switch assembly mounted on a square bollard in accordance with an aspect of the invention.
Figure 5:
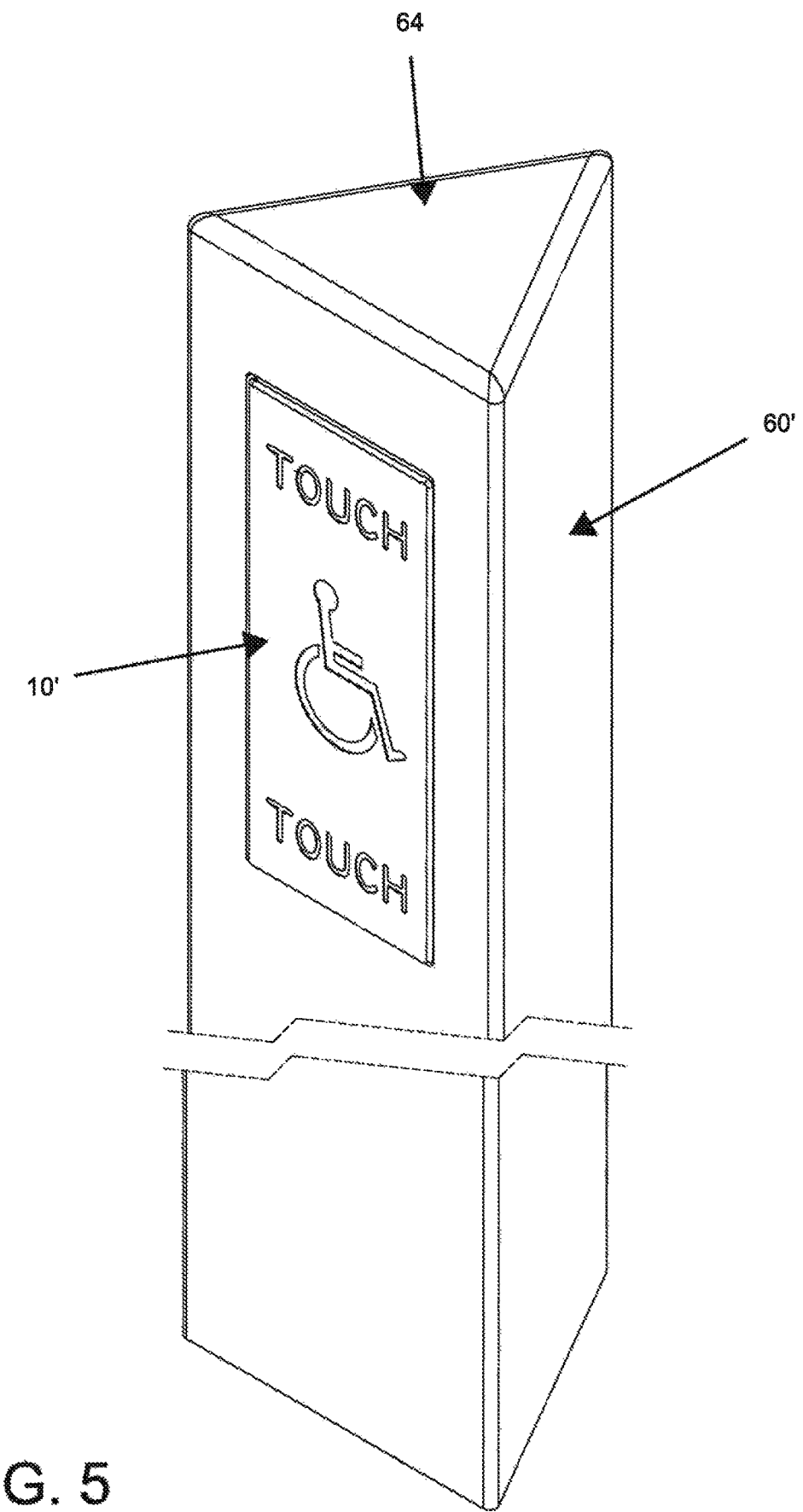
FIG. 5 is a round switch assembly mounted on a triangle bollard in accordance with an aspect of the invention.
Figure 6:
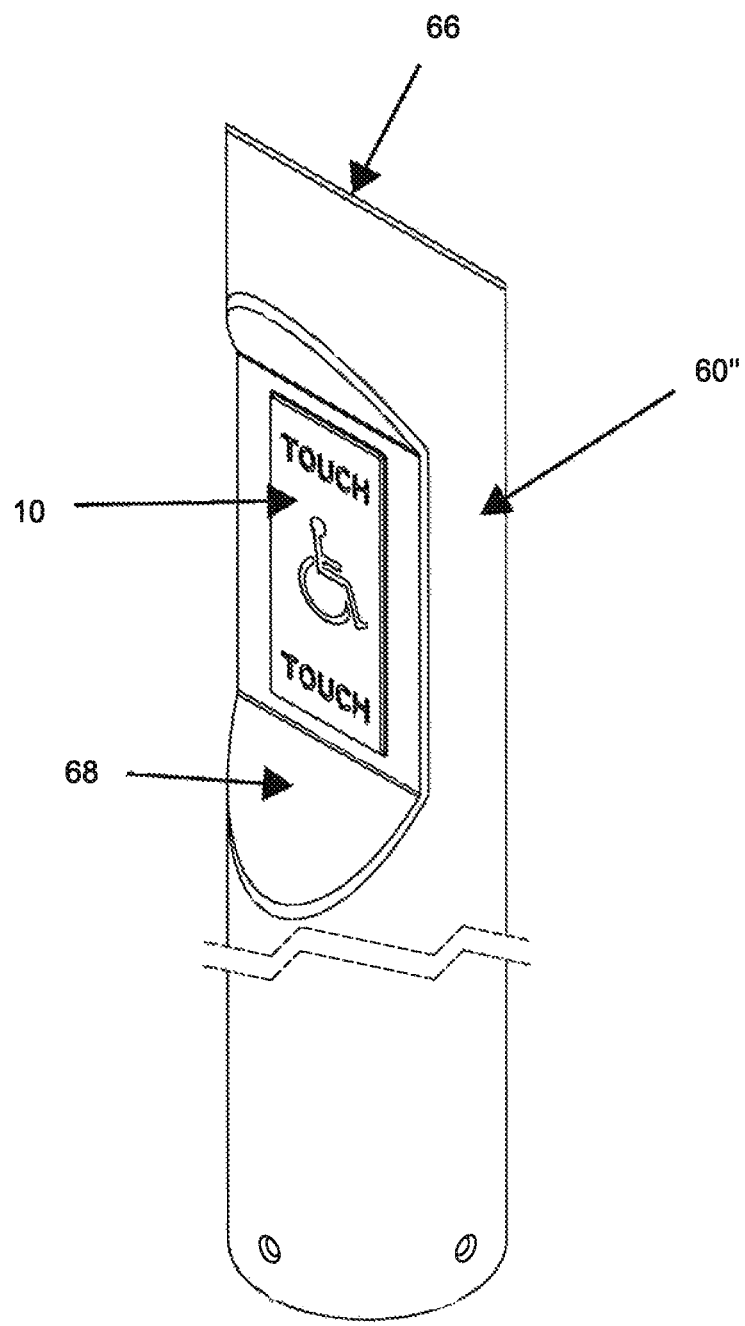
FIG. 6 is a switch assembly mounted in a flat recessed area of an angle top bollard in accordance with an aspect of the invention.

In accordance with an aspect of the invention, various configurations of switch assemblies 10 can be advantageously mounted to various configurations of bollards, as building requirements may require, with improved sensitivity and reliability. Such switch assemblies 10 could be rectangular, round or other shaped, being matched with bollards that could be rectangular, round or other shaped. For example, with reference to FIGS. 4-6, where like numerals refer to like parts throughout, and in particular to FIG. 4, a round or rectangular switch assembly 10 could be mounted to a flat surface of a square bollard 60 having a removable square flat top 62. Also, with reference to FIG. 5, a round or rectangular switch assembly 10 could be mounted to a flat surface of a triangle bollard 60' having a removable triangle flat top 64. Also, with reference to FIG. 6, a round or rectangular switch assembly 10 could be mounted to a round bollard 60" having a removable angle top 66. In particular, the switch assembly 10 can be mounted in a flat recessed area 68 (having a flat surface) to accommodate the rigid planar surfaces of the switch assembly 10 on the circular shape of the round bollard 60". Various combinations of switch assemblies 10 mounted with respect to bollards 60 can be made within the scope of the invention.

Referring now to FIGS. 7-10, in accordance with other aspects of the invention, where like numerals refer to like parts throughout, systems having larger inner and outer mounting plates, such as the inner mounting plates 16' or 16", or the outer mounting plates 14' or 14", can include an array 52 of multiple piezoelectric sensors 12 specifically distributed with respect to the mounting plate. Such larger mounting plates may be useful for providing very large surfaces areas for persons to more easily make physical contact with the switch assembly, such as by rolling a wheel of wheelchair into a corresponding outer mounting plate, or by bumping a tip of a cane into the corresponding outer mounting plate, to provide the pressure P to produce the electrical signal to activate the switch. Such larger mounting plates could have large dimensions, for example, of about 6 inches wide by about 36 inches tall, for mounting to a wall or bollard vertically upward from the ground, including occupying over 75% of a forward facing surface of a bollard, as illustrated in FIG. 9. In this application, the piezoelectric sensors 12 could comprise, for example, round sensors each having a smaller piezoelectric element 18 exposing a top surface 12a, e.g., about 1 inch across in length, mounted to a larger substrate 20 exposing a bottom surface 12b (opposite the top surface 12a), e.g., about 1.4 inches across in length.

In addition, with improved sensitivity, switches of the present invention having larger mounting plates can operate with a reduced number of piezoelectric sensors. For example, with the inner mounting plate 16 (and corresponding outer mounting plate), being about 6 inches wide by about 36 inches tall, the array 52 can include as few as four piezoelectric sensors 12' with equidistant distribution. In one aspect, with a rectangular shaped mounting plate, one piezoelectric sensor can be used 12' in the array 52 for every 54 square inches of surface area of the mounting plate.

Figures 7, 8:
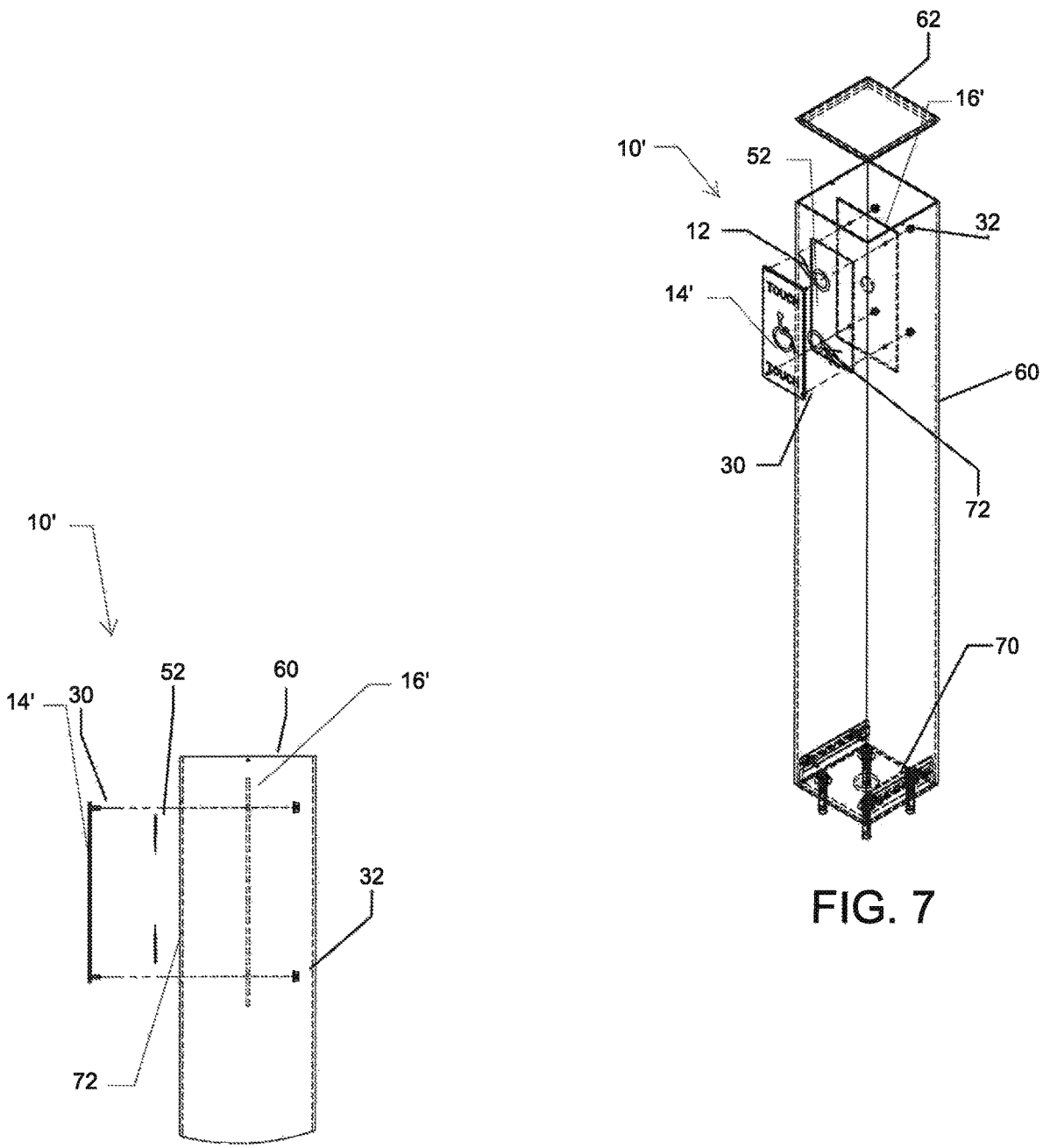
FIG. 7 is an exploded view of a rectangular switch assembly mounted on a square bollard in accordance with an aspect of the invention.
FIG. 8 is a detailed cross-sectional view of the switch assembly mounted to the bollard of FIG. 7.

Referring now to FIG. 7 (and corresponding alternative FIG. 9), an exploded view of a rectangular switch assembly 10' mounted on a square bollard 60 is shown by way of example. The bollard 60 can be mounted to a sidewalk, street or other hard surface via one or more brackets 70 to essentially render the bollard 60 immovable. A square flat top 62 of the bollard 60 can be removed to accommodate installation of the switch assembly 10'. As may best be seen in the detailed cross-sectional view of FIG. 8 (and corresponding alternative FIG. 10), an inner mounting plate 16' can be placed inside the bollard 60, being centered with respect to a defined opening 72 formed on one side of the bollard 60. The opening 72 is typically on a side accessible for receiving physical contact. Accordingly, the inner mounting plate 16' can surround the opening 72 on an interior surface of the bollard 60. From outside the bollard 60, an array 52 of piezoelectric sensors 12' can be placed over the inner mounting plate 16', being centered with respect to the opening 72 (now covered from the inside by the inner mounting plate 16'), rigidly supporting, and directly abutting, the inner mounting plate 16'. Signal and ground conductors 22 and 24, respectively, of each piezoelectric sensor 12' can feed through an aperture of the inner mounting plate 16' for connection to the controller 42. A corresponding outer mounting plate 14' can placed over the opening 72, rigidly supporting, and directly abutting the array 52 of piezoelectric sensors, fitting flush with the bollard 60 to for in a continuous planar surface of the bollard (without any protrusion of the switch assembly 10'). Fasteners 30 can connect with nuts 32 to join the outer and inner mounting plates 14' and 16', respectively, together. As a result, the outer and inner mounting plates 14' and 16', respectively, will be parallel with the array 52 fitting flush in between. In addition, the inner mounting plate 16' will be rigidly supported by the bollard 60 to prevent movement. Accordingly, light pressure at any spot on the outer mounting plate 14' will compress one or more the piezoelectric sensor of the array 52 between the plates to induce a mechanical stress on the piezoelectric sensor to produce an electrical signal for controlling operation of a door or elevator. The alternative aspect of FIGS. 9 and 10 operate similarly to the aspect of FIGS. 7 and 8, but with substantially larger mounting plates, occupying over 75% of a forward facing surface of the bollard.

Certain terminology is used herein for purposes of reference only, and thus is not intended to be limiting. For example, terms such as "top" and "bottom" refer to directions in the drawings to which reference is made. Terms such as "top" and "bottom" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. An electrical switch assembly comprising:
   a piezoelectric sensor including a piezoelectric element defining an exposed top surface having an outer periphery and a substrate mounted to the piezoelectric element and defining an exposed bottom surface having an outer periphery;
   first and second mounting plates, the first and second mounting plates including corresponding rigid planar surfaces in parallel to one another, the first mounting plate rigidly supports the piezoelectric sensor on a top surface of the piezoelectric sensor and the second mounting plate rigidly supports the piezoelectric sensor on a bottom surface of the piezoelectric sensor such that the piezoelectric sensor is rigidly supported in between the first and second mounting plates; and
   a plurality of fasteners extending between the first and second mounting plates, the fasteners configured to guide axial movement of the first mounting plate toward and away from the second mounting plate and to prevent pivotable movement of the first mounting plate relative to the second mounting plate;
   wherein:
   the second mounting plate is rigidly supported to prevent movement;
   pressure on the first mounting plate compresses the piezoelectric sensor between the first and second mounting plates to induce a mechanical stress on the piezoelectric sensor that is operable to produce an electrical signal; and
   the outer periphery of the top surface of the piezoelectric element abuts the planar surface of the first mounting plate and the outer periphery of the bottom surface of the substrate abuts the planar surface of the second mounting plate.

2. The electrical switch assembly of claim 1, further comprising a controller receiving the electrical signal and executing a program stored in a non-transient medium in response to the electrical signal to activate a relay controlling operation of a door or elevator.

3. The electrical switch assembly of claim 2, further comprising the controller executing to activate a light or sound to provide feedback indicating the pressure.

4. The electrical switch assembly of claim 3, further comprising the controller executing to activate the light or sound for less than a second.

5. The electrical switch assembly of claim 3, further comprising the controller executing to activate the sound by controlling a periodic signal driven back to the piezoelectric sensor to cause an oscillation of the piezoelectric sensor.

6. The electrical switch assembly of claim 5, wherein the periodic signal is driven on a same conductor in which the electrical signal is received by the controller.

7. The electrical switch assembly of claim 1, wherein the piezoelectric sensor comprises the piezoelectric element exposing the top surface is smaller than the substrate exposing the bottom surface.

8. The electrical switch assembly of claim 1, wherein the first and second mounting plates each have surface areas that are at least twice as large as any surface area of the piezoelectric sensor.

9. The electrical switch assembly of claim 1, wherein the piezoelectric sensor is square, and wherein the piezoelectric sensor is centered with respect to the first and second mounting plates.

10. The electrical switch assembly of claim 1, wherein the piezoelectric sensor is one piezoelectric sensor among a plurality of piezoelectric sensors disposed directly between the first and second mounting plates.

11. The electrical switch assembly of claim 1, wherein the second mounting plate is rigidly supported by a wall or bollard.

12. The electrical switch assembly of claim 1, further comprising a cover which abuts the first mounting plate, wherein the cover includes an indicium comprising a wheelchair symbol.

13. An electrical switching method comprising:
   layering a first mounting plate including a rigid planar surface over an exposed top surface of a piezoelectric element of a piezoelectric sensor such that:
      an outer periphery of the top surface of the piezoelectric element abuts the planar surface of the first mounting plate rigidly supports the piezoelectric sensor on a top surface of the piezoelectric element;
   layering a second mounting plate including a rigid planar surface under an exposed bottom surface of a substrate of the piezoelectric sensor such that:
      an outer periphery of the bottom surface of the substrate abuts the planar surface of the second mounting plate and the second mounting plate rigidly supports the piezoelectric sensor on a bottom surface of the substrate directly opposing the top surface with the first and second mounting plates being parallel to one another;
   rigidly supporting the second mounting plate to prevent movement;
   operatively connecting the first and second mounting plates in a parallel relationship such that the first mounting plate is axially moveable toward and away from the second mounting plate and the first mounting plate is prevented from pivotable movement relative to the second mounting plate;
   producing an electrical signal from the piezoelectric sensor upon application of pressure on the first mounting plate compressing the piezoelectric sensor between the first and second mounting plates to induce a mechanical stress on the piezoelectric sensor; and
   controlling an operation in response to the electrical signal.

14. The electrical switching method of claim 13, further comprising activating a relay for controlling operation of a door or elevator.

15. The electrical switching method of claim 14, further comprising activating a light or sound to provide feedback indicating the pressure.

16. The electrical switching method of claim 15, further comprising activating the sound by controlling a periodic signal driven back to the piezoelectric sensor to cause an oscillation of the piezoelectric sensor.

17. The electrical switching method of claim 16, further comprising driving the periodic signal on a same conductor in which the electrical signal is received.

18. The electrical switching method of claim 13, wherein the piezoelectric sensor is square, and further comprising centering the piezoelectric sensor with respect to the first and second mounting plates.

19. The electrical switching method of claim 13, further comprising rigidly supporting the second mounting plate by a wall or bollard with a plurality of fasteners joining the first and second mounting plates together.

20. The electrical switching method of claim 13, further comprising layering a cover over the first mounting plate so that the cover abuts the first mounting plate, wherein the cover includes an indicium comprising a wheelchair symbol.

* * * * *